(12) United States Patent
Ishizawa

(10) Patent No.: US 10,468,278 B2
(45) Date of Patent: Nov. 5, 2019

(54) SUBSTRATE TRANSFER METHOD AND SUBSTRATE PROCESSING APPARATUS

(71) Applicant: Tokyo Electron Limited, Tokyo (JP)

(72) Inventor: Shigeru Ishizawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 291 days.

(21) Appl. No.: 15/068,759

(22) Filed: Mar. 14, 2016

(65) Prior Publication Data
US 2016/0284577 A1 Sep. 29, 2016

(30) Foreign Application Priority Data
Mar. 26, 2015 (JP) .................................. 2015-064137

(51) Int. Cl.
*H01L 21/67* (2006.01)
*H01L 21/677* (2006.01)

(52) U.S. Cl.
CPC .. *H01L 21/67201* (2013.01); *H01L 21/67745* (2013.01)

(58) Field of Classification Search
CPC ......... H01L 21/67201; H01L 21/67196; H01L 21/67748; H01L 21/67754; H01L 21/67167; G05B 19/4189; G05B 19/41815
See application file for complete search history.

(56) References Cited

U.S. PATENT DOCUMENTS

| | | | | |
|---|---|---|---|---|
| 5,795,355 A * | 8/1998 | Moran | ............... | H01L 21/67167 29/25.01 |
| 6,048,154 A * | 4/2000 | Wytman | ........... | H01L 21/67748 414/217 |
| 6,059,507 A * | 5/2000 | Adams | .................. | G03F 7/7075 414/217 |
| 6,090,176 A * | 7/2000 | Yoshitake | ......... | H01L 21/67748 118/719 |
| 6,338,626 B1 * | 1/2002 | Saeki | ................ | H01L 21/67161 432/243 |
| 6,530,732 B1 * | 3/2003 | Theriault | ............ | H01L 21/6719 118/719 |
| 6,743,329 B1 * | 6/2004 | Kyogoku | .......... | H01L 21/67757 118/733 |

(Continued)

FOREIGN PATENT DOCUMENTS

| | | |
|---|---|---|
| JP | H11-233583 | 8/1999 |
| JP | 2001-068524 | 3/2001 |

(Continued)

*Primary Examiner* — Glenn F Myers
(74) *Attorney, Agent, or Firm* — IPUSA, PLLC

(57) ABSTRACT

A substrate transfer method of a substrate processing apparatus that includes a load lock chamber including a drive unit that is capable of forming, between a first opening at an atmospheric side and a second opening connected to a transfer chamber of a housing of the load lock chamber, each of a first space in which a single substrate is capable of being transferred, and a second space in which a plurality of substrates are capable of being transferred, the substrate transfer method including selecting either of the first space or the second space of the load lock chamber in accordance with process statuses of substrates at a plurality of processing chambers, and controlling the drive unit based on the selected result to form either of the first space or the second space.

9 Claims, 8 Drawing Sheets

(56) References Cited

U.S. PATENT DOCUMENTS

| | | | | |
|---|---|---|---|---|
| 8,440,048 B2* | 5/2013 | Aggarwal | ......... | H01L 21/67201 |
| | | | | 156/345.1 |
| 2014/0124069 A1* | 5/2014 | Hara | ....................... | F16K 51/02 |
| | | | | 137/565.23 |

FOREIGN PATENT DOCUMENTS

| | | |
|---|---|---|
| JP | 2004-273646 | 9/2004 |
| JP | 2012-253348 | 12/2012 |

* cited by examiner

| Time | LA PickA | LA PickB | ORT | LLM1 | LLM2 | VA PickC | VA PickD | PM1 | PM2 | PM3 | PM4 | PM5 | PM6 |
|---|---|---|---|---|---|---|---|---|---|---|---|---|---|
| 1 | W101 | | | | | | | | | | | | |
| 2 | | | W101 | | | | | | | | | | |
| 3 | W102 | | ORT | | | | | | | | | | |
| 4 | → | W101 | → | | | | | | | | | | |
| 5 | | → | W102 | | | | | | | | | | |
| 6 | | | ORT | W101 | | | | | | | | | |
| 7 | W103 | | → | VAC | | | | | | | | | |
| 8 | → | W102 | W103 | → | W102 | | | | | | | | |
| 9 | | → | ORT | → | VAC | | | | | | | | |
| 10 | | | → | → | → | W101 | | | | | | | |
| 11 | W104 | | W104 | atm | → | | | | | | | | |
| 12 | → | W103 | ORT | → | → | W102 | | W101 | | | | | |
| 13 | | → | → | → | | | | main | | | | | |
| 14 | | → | → | → | | | | → | | | | | |
| 15 | | | → | W103 | | | | → | | | | | |
| 16 | | | | | | | | | W102 | | | | |

| Time | LA PickA | LA PickB | ORT | LLM1 | LLM2 | VA PickC | VA PickD | PM1 | PM2 | PM3 | PM4 | PM5 | PM6 |
|---|---|---|---|---|---|---|---|---|---|---|---|---|---|
| n+0 | WA01 | | | | | | | | | | WAxx main | | |
| n+1 | → | WAyy | | | | | | | | | → | WAyy main | |
| n+2 | → | → | WA01 | | | | | | | | → | → | |
| n+3 | WBww | → | ORT | WBxx atm | | | | | | | → | → | |
| n+4 | → | → | → | → | | | WByy | | | | → | → | |
| n+5 | WA02 | → | WA02 | → | WAzz VAC | WAyy | → | | | | → | → | |
| n+6 | → | WA01 | → | → | → | → | → | | | | → | → | WAzz main |
| n+7 | → | → | ORT | → | → | → | → | | | | → | → | → |
| n+8 | WBxx | → | → | WA01 VAC | → | WAzz | | | | | → | → | → |
| n+9 | → | → | WA03 | → | → | → | WBzz | | | | → | → | → |
| n+10 | → | → | → | → | WByy atm | WA01 | → | | | | → | → | → |
| n+11 | WA03 | → | ORT | → | → | → | WB01 | | | | → | → | → |
| n+12 | → | WA02 | → | → | → | → | → | | | | → | → | → |
| n+13 | → | → | WA04 | → | WA02 VAC | | | WA01 main | | | → | → | → |
| n+14 | WByy | → | → | WBzz atm | → | WA02 | | → | | | → | → | → |
| n+15 | → | → | ORT | → | → | → | | → | | | → | → | → |
| n+16 | → | → | → | → | → | | WB02 | → | | | → | → | → |
| n+17 | WA04 | → | → | WA03 VAC | WB01 atm | | → | → | | | → | → | → |
| n+18 | → | WA03 | ORT | → | → | WA03 | | → | | | → | → | → |
| n+19 | → | → | → | → | → | → | | → | | | → | → | → |
| n+20 | WBzz | → | WA05 | → | → | | WB03 | → | | | → | → | → |
| n+21 | → | → | ORT | WB02 atm | WA04 VAC | | → | → | | | → | → | → |
| n+22 | WA05 | → | → | → | → | | | → | WA02 main | | → | → | → |
| n+23 | → | WA04 | → | → | → | | | → | → | | → | → | → |
| n+24 | → | → | → | → | → | | | → | → | | → | → | → |
| n+25 | → | → | → | → | → | | | → | → | | → | → | → |
| n+26 | WB01 | → | → | → | → | | | → | → | | → | → | → |
| n+27 | → | → | → | → | → | | | → | → | | → | → | → |
| n+28 | WA06 | → | → | → | → | | | → | → | | → | → | → |
| n+29 | → | → | → | → | → | | | → | → | WA03 | → | → | → |
| n+30 | → | → | → | → | → | | | → | → | → | → | → | → |
| n+31 | | WA05 | | | | | | | | | | | |

SUBSTRATE TRANSFER METHOD AND SUBSTRATE PROCESSING APPARATUS

CROSS-REFERENCE TO RELATED APPLICATION

The present application is based on and claims the benefit of priority of Japanese Priority Application No. 2015-064137 filed on Mar. 26, 2015, the entire contents of which are hereby incorporated by reference.

BACKGROUND OF THE INVENTION

1. Field of the Invention

The present invention relates to a substrate transfer method and a substrate processing apparatus.

2. Description of the Related Art

In order to efficiently perform a semiconductor manufacturing process, a substrate processing apparatus that has a cluster structure provided with a plurality of processing chambers is provided. In such a substrate processing apparatus, a plurality of substrates are transferred to the plurality of processing chambers, and the plurality of substrates are processed in the plurality of processing chambers, respectively, in parallel.

When different processes are performed in the plurality of processing chambers, process times may be different. In such a case, timings for carrying substrates into/out from the plurality of processing chambers may overlap. Thus, there may be a case that, when a preceding substrate is being carried into/out from one of the processing chambers, carrying of a substrate into/out from another one of the processing chambers is suspended. In order to shorten this waiting time, it can be considered to provide a buffer portion, on which a substrate to be processed next is mounted, in a vacuum state transfer chamber. However, as it is necessary to carry the substrate into/out from the buffer portion by an arm under a vacuum state, additional transferring time is necessary and there may be a case that carrying of another substrate into/out from another processing chamber is suspended.

Thus, Patent Document 1 discloses a substrate processing apparatus capable of carrying a plurality of substrates into/out from a load lock chamber by providing a buffer portion, on which the plurality of substrates are capable of being mounted, in the load lock chamber.

However, the volume of the load lock chamber increases by providing the buffer portion therein. Thus, evacuating time for changing the pressure of the load lock chamber between an atmospheric pressure and a vacuum pressure increases. Because of this, the maximum value of a mechanical throughput for the substrate processing apparatus as a system is lowered.

In order to solve this problem, a method of rapidly vacuuming the load lock chamber or exposing the load lock chamber to the atmosphere is considered, however, in such a case, there is another problem such as flinging up of particles, condensation or the like occurs.

Further, a case may be considered in which two load lock chambers, one of which is capable of transferring a plurality of substrates and the other of which is capable of transferring a single substrate, are provided, and one of them is selected in accordance with process statuses of the substrates. However, in such a case, footprint increases.

Patent Document

[Patent Document 1] Japanese Laid-open Patent Publication No. 2012-253348

SUMMARY OF THE INVENTION

The present invention is made in light of the above problems, and provides a technique capable of efficiently transferring substrates by changing a transferring space in a load lock chamber.

According to an embodiment, there is provided a substrate transfer method of a substrate processing apparatus that includes a transfer chamber that transfers a substrate, a plurality of processing chambers provided around the transfer chamber, each of the processing chambers processing a substrate, and a load lock chamber provided around the transfer chamber, capable of being selectively retained at between an atmospheric pressure and a vacuum pressure, the load lock chamber including a housing provided with a first opening at an atmospheric side, and a second opening connected to the transfer chamber, and a drive unit that is capable of forming, as a transferring space between the first opening and the second opening, each of a first space in which a single substrate is capable of being transferred, and a second space in which a plurality of substrates are capable of being transferred, in the housing, the substrate transfer method including selecting either of the first space or the second space of the load lock chamber in accordance with process statuses of substrates at the plurality of processing chambers, and controlling the drive unit based on the selected result to form either of the first space or the second space.

BRIEF DESCRIPTION OF THE DRAWINGS

Other objects, features and advantages of the present invention will become more apparent from the following detailed description when read in conjunction with the accompanying drawings.

FIG. 7 is a table illustrating an example of a transferring flow of wafers of the embodiment; and FIG. 8 is a table illustrating an example of a transferring flow of the wafers of the embodiment.

DETAILED DESCRIPTION OF THE PREFERRED EMBODIMENTS

Figure 1:
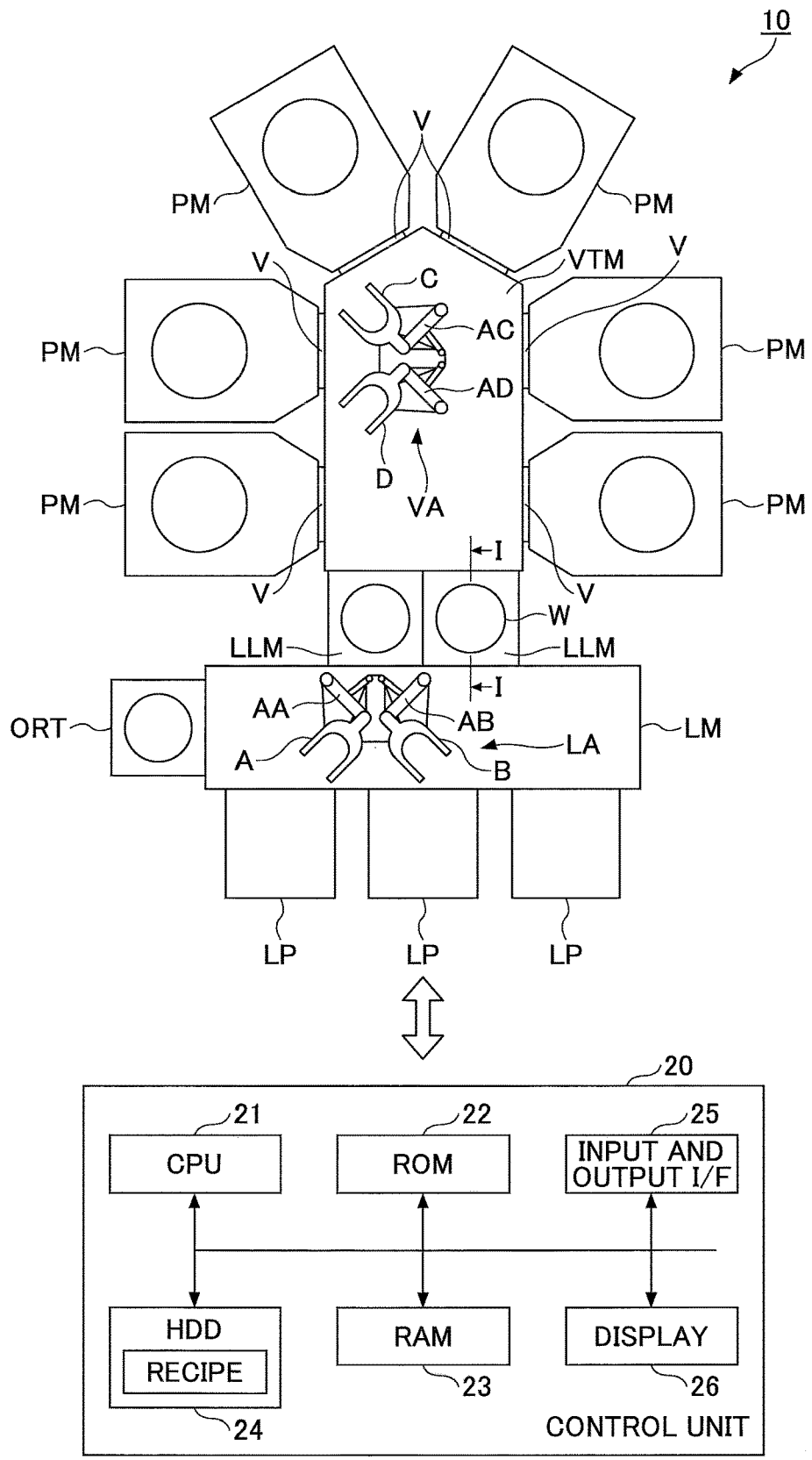
FIG. 1 is a view illustrating an example of a structure of the entirety of a substrate processing apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Entire Structure of Substrate Processing Apparatus)

First, an example of a structure of the entirety of a substrate processing apparatus 10 of the embodiment is described with reference to FIG. 1. The substrate processing apparatus 10 illustrated in FIG. 1 is an example of a substrate processing apparatus having a cluster structure (multi-chamber type).

The substrate processing apparatus 10 includes six processing chambers PM (Process Module), a transfer chamber VTM (Vacuum Transfer Module), two load lock chambers LLM (Load Lock Module), a loader module LM (Loader Module), three load ports LP (Load Port) and a control unit 20.

The six processing chambers PM are provided around the transfer chamber VTM, and perform predetermined processes on wafers W, respectively. The processing chambers PM are connected to the transfer chamber VTM via gate valves V that are capable of opening and closing, respectively. In each of the processing chambers PM, the pressure is reduced to a predetermined vacuum pressure and a process such as an etching process, a film deposition process, a cleaning process, an ashing process or the like is performed on the wafer W by plasma or non-plasma.

A transfer apparatus VA that transfers the wafer W is provided in the transfer chamber VTM. The transfer apparatus VA includes two robot arms AC and AD each capable of bending, extending and rotating. Picks C and D are attached to front end portions of the robot arms AC and AD, respectively. The transfer apparatus VA is capable of holding the wafer W by each of the picks C and D, carries the wafer W into/out from the six processing chambers PM, and carries the wafer W into/out from the two load lock chambers LLM.

The load lock chambers LLM are provided between the transfer chamber VTM and the loader module LM. The load lock chamber LLM is capable of being retained between an atmospheric pressure and a vacuum pressure, transfers the wafer W from the loader module LM at an atmospheric side to the transfer chamber VTM at a vacuum side, and transfers the wafer W from the transfer chamber VTM at the vacuum side to the loader module LM at the atmospheric side. In this embodiment, the two load lock chambers LLM are provided. In the following, one of the load lock chambers LLM is referred to as a "load lock chamber LLM1" and the other of the load lock chambers LLM is referred to as a "load lock chamber LLM2" as well.

Inside the loader module LM is maintained clean by downflow through a ULPA filter, and is maintained a slightly positive pressure than the atmospheric pressure. Three load ports LP are provided at a side wall of the loader module LM at a long side. A FOUP (Front Opening Unified Pod) in which 25 wafers, for example, are contained or an empty FOUP is attached to each of the load ports LP. The load ports LP function as entrances and exits for the wafers W from which the wafers W are carried out to the processing chambers PM and further to which the wafers W processed by the processing chambers PM are carried in.

A transfer apparatus LA that transfers the wafer W is provided in the loader module LM. The transfer apparatus LA includes two robot arms AA and AB each capable of bending, extending and rotating. Picks A and B are attached to front end portions of the robot arms AA and AB, respectively. The transfer apparatus LA is capable of holding the wafer W by each of the picks A and B, carries the wafer W into/out from the FOUPs, and carries the wafer W into/out from the two load lock chambers LLM.

The loader module LM is provided with an orienter ORT for aligning a position of the wafer W. The orienter ORT is provided at an end of the loader module LM in a longitudinal direction. The orienter ORT detects a center position, eccentricity and a notch position of the wafer W. Each of the robot arms AA and AB of the loader module LM corrects the position of the wafer W based on the result detected by the orienter ORT.

Specifically, each of the robot arms AA and AB carries an unprocessed wafer out from the FOUP mounted on the load port LP, and transfers it to the orienter ORT. Then, each of the robot arms AA and AB transfers the wafer to the load lock chamber LLM after correcting the position of the wafer in the loader module LM based on the result detected by the orienter ORT. Further, each of the robot arms AA and AB carries a wafer processed in the processing chamber PM out from the load lock chamber LLM and mounts it on a predetermined one of the FOUPs.

Here, the number of each of the processing chambers PM, the load lock chambers LLM, the loader modules LM and the load ports LP is not limited to that described in this embodiment, and may be arbitrarily determined.

The control unit 20 includes a Central Processing Unit (CPU) 21, a Read Only Memory (Read Only Memory) 22, a Random Access Memory (RAM) 23, a Hard Disk Drive (HDD) 24, an input and output interface (I/F) 25 and a display 26. Here, the control unit 20 may include another storage area, not limited to the HDD 24, such as a Solid State Drive (SSD) or the like.

The CPU 21 controls processing of the wafers W in the processing chambers PM, respectively, in accordance with a recipe in which methods of a process and conditions of the process are set. The HDD 24 stores the recipe. However, the recipe may be stored in the ROM 22 or the RAM 23. The HDD 24 or the RAM 23 may store a program for performing the switching of the load lock chamber LLM, which will be explained below. The recipe and the program for performing the above described switching may be provided in a stored manner in a storage medium. Further, these recipe and program may be provided from an external device via a network. Here, the function of the control unit 20 may be actualized by an operation using software or an operation using hardware.

The input and output interface (I/F) 25 functions as an interface that obtains input and output data from command operations performed by an operator for managing the substrate processing apparatus 10. The display 26 displays a process status or the like in each of the processing chambers PM.

(Internal Structure of Load Lock Chamber)

Figure 2:
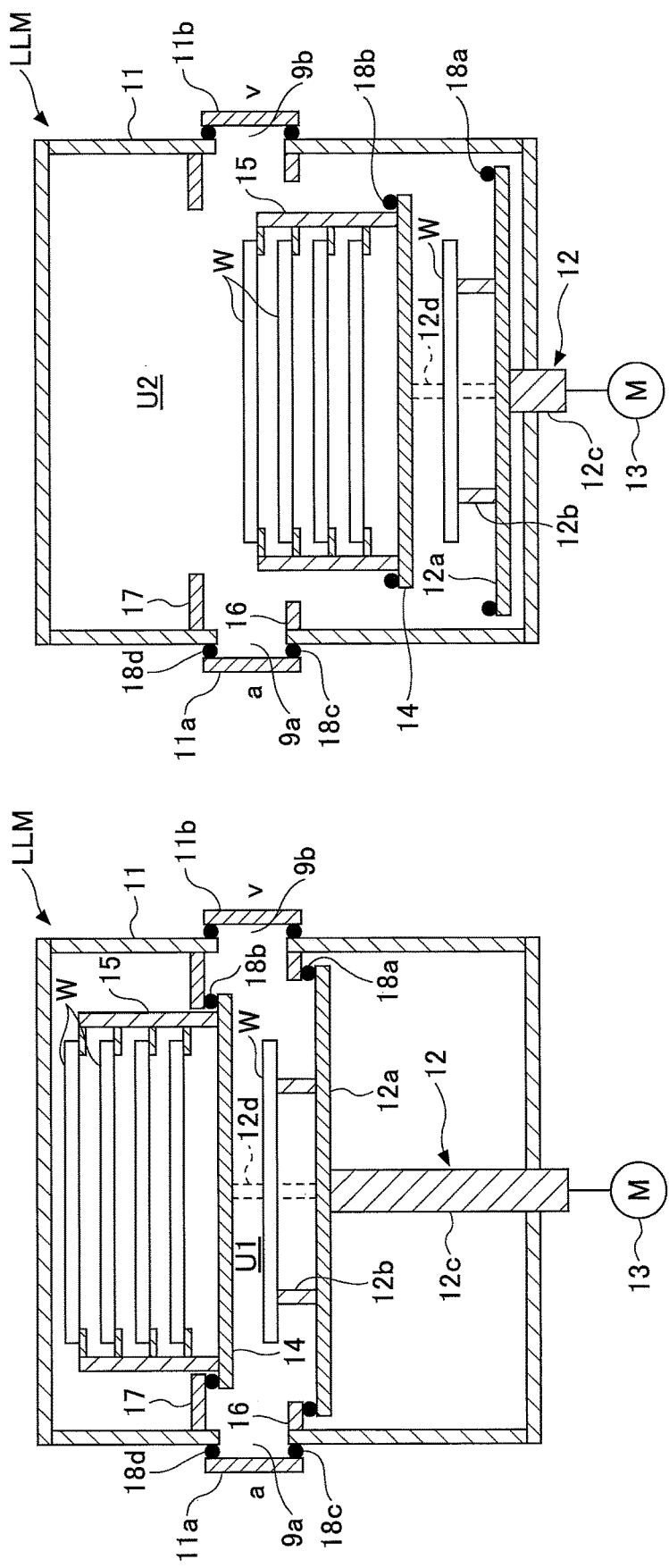
FIGS. 2A and 2B are vertical cross-sectional views of an example of a load lock chamber of the embodiment.
Figure 3:
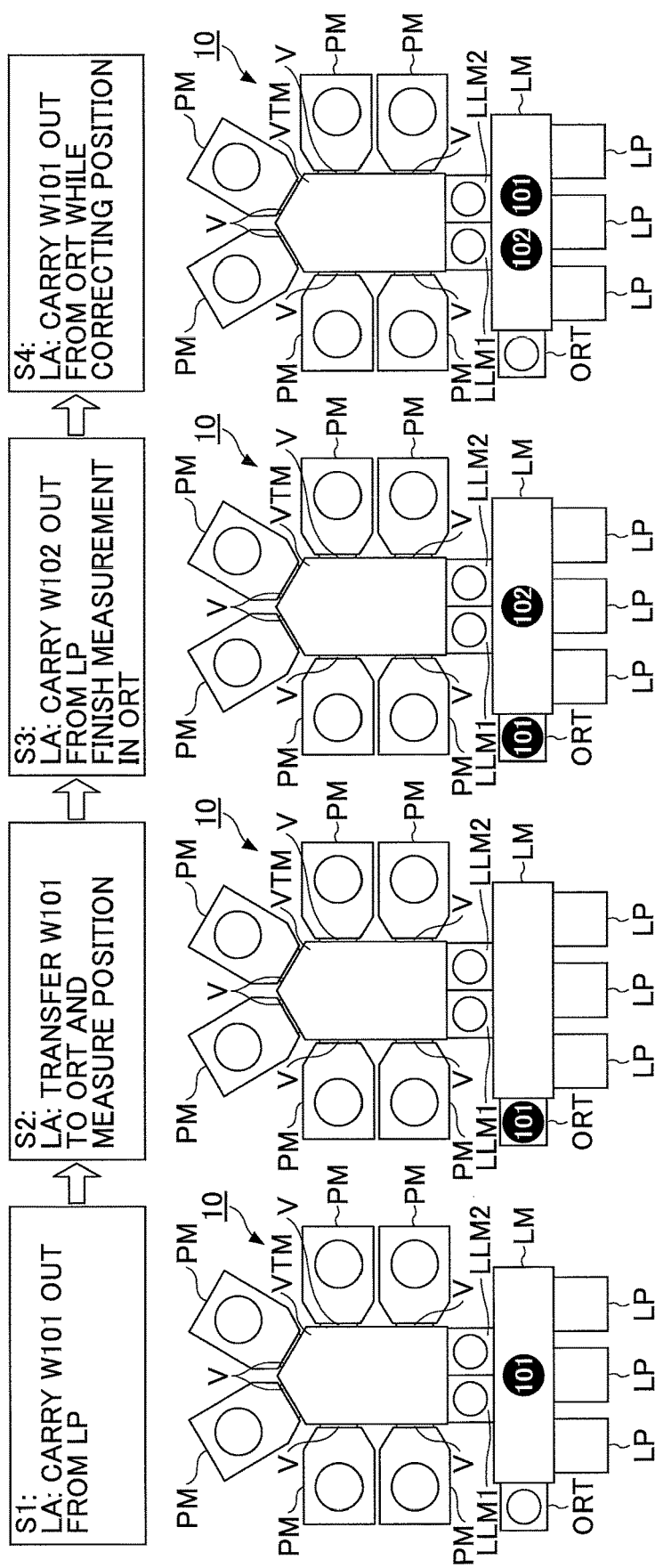
FIG. 3 is a view illustrating an example of a transferring flow of wafers of the embodiment.
Figure 4:
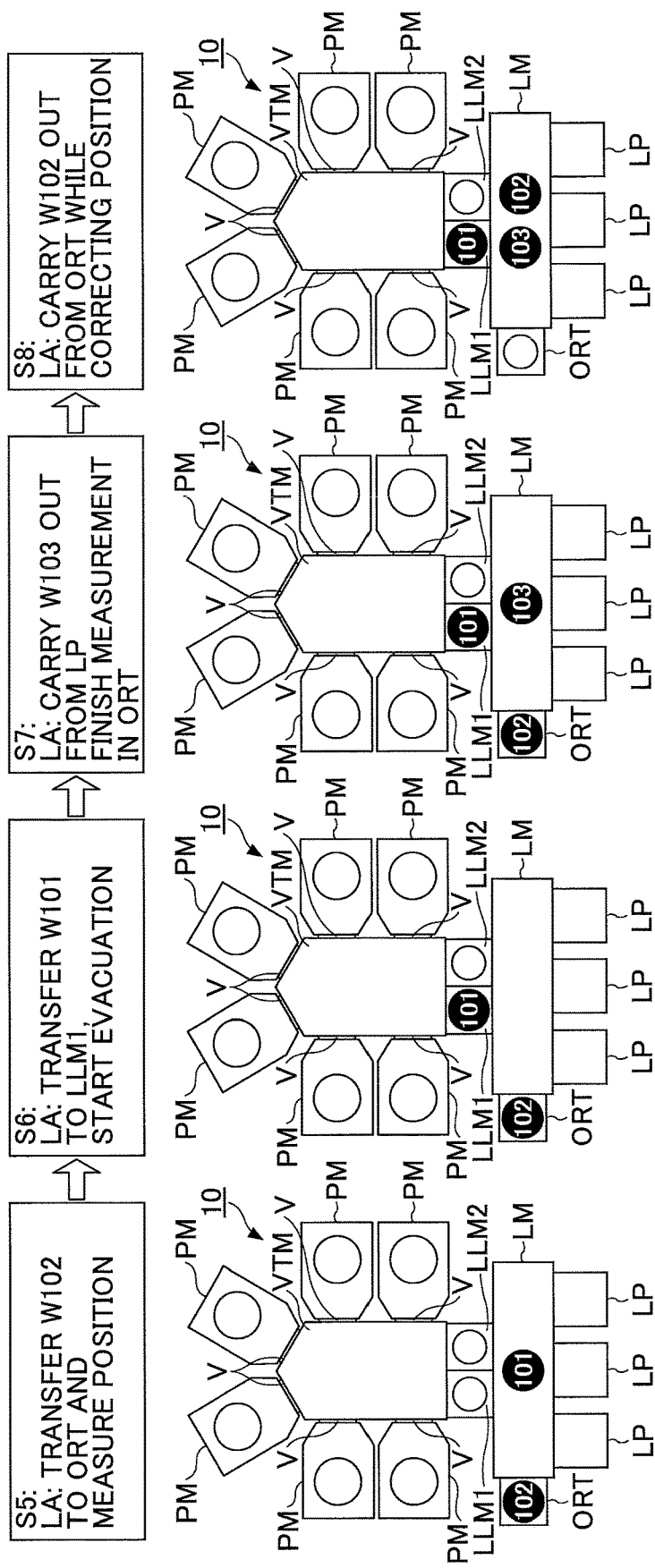
FIG. 4 is a view illustrating an example of the transferring flow of the wafers of the embodiment.
Figure 5:
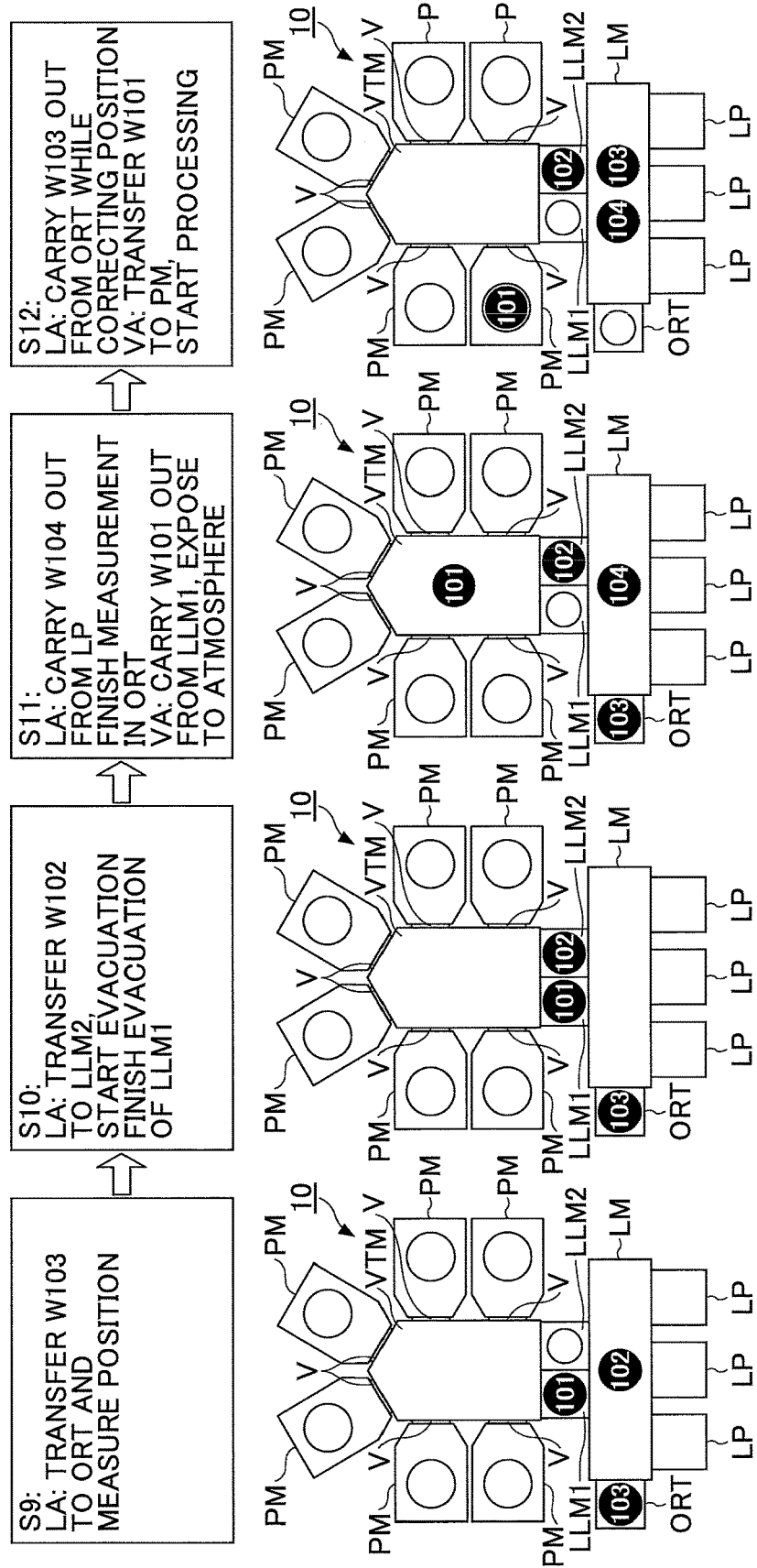
FIG. 5 is a view illustrating an example of the transferring flow of the wafers of the embodiment.
Figure 6:
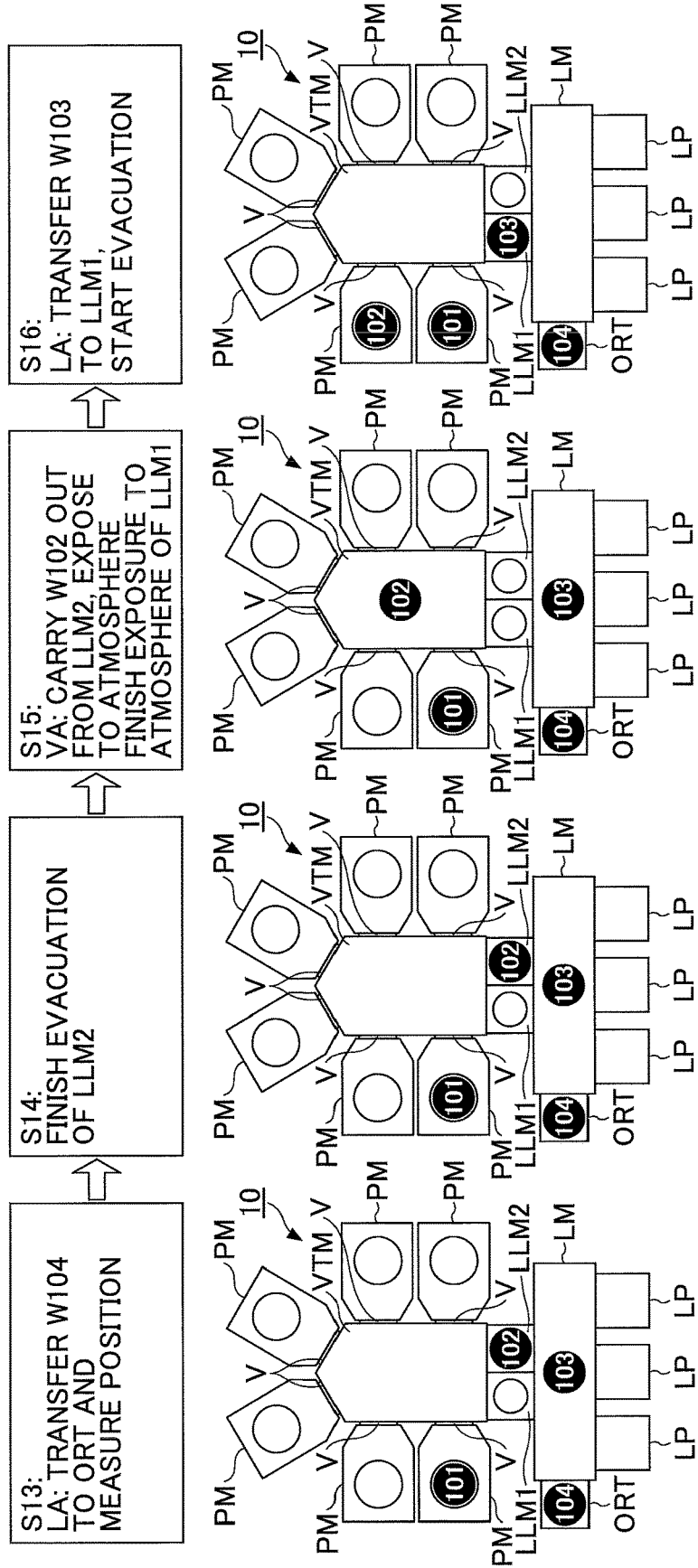
FIG. 6 is a view illustrating an example of the transferring flow of the wafers of the embodiment.

Next, an internal structure of the load lock chamber LLM is described with reference to FIG. 2A and FIG. 2B. FIG. 2A and FIG. 2B are vertical cross-sectional views illustrating an example of the load lock chamber LLM of the embodiment. The cross-sectional views of the load lock chamber LLM of FIG. 2A and FIG. 2B correspond to cross-sections taken along an I-I line of the load lock chamber LLM of FIG. 1. Thus, in FIG. 2A and FIG. 2B, a left side of a housing 11 of the load lock chamber LLM is connected to the loader module LM that is maintained almost at the atmospheric pressure (illustrated as "a"), and a right side of the housing 11 is connected to the transfer chamber VTM that is maintained at the vacuum pressure (illustrated as "v").

The housing 11 is provided with a first opening 9a at a side wall at a loader module LM side for transferring the wafer W between the load lock chamber LLM and the loader module LM. The first opening 9a is opened and closed by an opening and closing member 11a provided at the side wall of the housing 11 at the loader module LM side. Similarly, the housing 11 is provided with a second opening 9b at a side wall at a transfer chamber VTM side for transferring the wafer W between the load lock chamber LLM and the transfer chamber VTM. The second opening 9b is opened and closed by an opening and closing member 11b provided at the side wall of the housing 11 at the transfer chamber VTM side.

A drive unit 12 that moves upward and downward while supporting the wafer W thereon is provided in the housing 11. The drive unit 12 includes a first stage 12a on which a single wafer W is capable of being mounted. The wafer W is held by a plurality of holding portions 12b that are provided on the first stage 12a. The first stage 12a is supported by a support portion 12c. The support portion 12c is connected to a motor 13 that is provided outside of the housing 11 and moves upward and downward by the power of a motor 13.

A second stage 14 is provided at an upper side of the first stage 12a. The second stage 14 is supported by a stick support portion 12d protruded from the first stage 12a, and is capable moving upward and downward together with the first stage 12a. The support portion 12d is provided at an outer periphery side of the wafer W mounted on the first stage 12a. For example, the second stage 14 may be supported by two or more of the support portions 12d. However, a method of supporting the second stage 14 is not limited so. For example, the support portion 12d may not be a stick.

The second stage 14 includes a buffer portion 15 in which a predetermined number of the wafers W can be housed, so that the plurality of wafers W can be continuously mounted on the second stage 14. In this embodiment, the buffer portion 15 is configured such that the number of wafers W same as the number of the processing chambers PM can be mounted thereon at most.

A partition plate 16 extending in a horizontal direction is provided at a lower side of the openings 6a and 9b, respectively, in the housing 11. Similarly, a partition plate 17 extending in the horizontal direction is provided at an upper side of the openings 6a and 9b, respectively, in the housing 11.

The drive unit 12 of the embodiment is capable of forming, as a transferring space between the first opening 9a and the second opening 9b, each of a first space U1 in which a single wafer W is capable of being transferred (see FIG. 2A), and a second space U2 in which a plurality of wafers W are capable of being transferred (see FIG. 2B), in the housing 11. The partition places 16 and 17 are provided for partitioning inside the load lock chamber LLM to form the first space U1 with the first stage 12a and the second stage 14.

As illustrated in FIG. 2A, when the first stage 12a and the second stage 14 are moved upward by the drive unit 12, the first space U1 is formed, and a clearance between the partition plate 16 and the first stage 12a is sealed by an O-ring 18a. Similarly, at this time, a clearance between the partition plate 17 and the second stage 14 is sealed by an O-ring 18b. Further, when the openings 9a and 9b are closed by the opening and closing members 11a and 11b, clearances between the opening and closing members 11a and 11b, and the housing 11 are sealed by O-rings 18c and 18d, respectively.

The O-rings 18a to 18d are an example of a sealing portion that dynamically forms the first space U1 to be a sealed space. As another example of the sealing portion, bellows may be used instead of the O-rings 18a to 18d.

Under this state, the first space U1 for transferring the wafer W on the first stage 12a is formed at a center portion of the load lock chamber LLM in a vertical direction, and this center portion of the load lock chamber LLM functions as a single wafer processing load lock. By the load lock chamber LLM at this state, a single wafer W can be transferred by opening and closing the openings 9a and 9b by the opening and closing members 11a and 11b, respectively.

As illustrated in FIG. 2B, when the first stage 12a and the second stage 14 are moved downward by the drive unit 12, inside the load lock chamber LLM is changed to form the second space U2 in which plurality of wafers W are transferred on the second stage 14. At this time, the second space U2 functions as a load lock that includes a buffer. Under this status of the load lock chamber LLM, the second stage 14 is moved upward and downward such that each of the wafers is capable of being transferred into and out from the buffer portion 15 via the first opening 9a or the second opening 9b. Under this status of the load lock chamber LLM, the plurality of wafers W can be transferred into and out from the buffer portion 15 every time either of the opening and closing member 11a or 11b is opened.

As such, according to the load lock chamber LLM of the embodiment, either of the first space U1 in which a single wafer W can be transferred or the second space U2 in which a plurality of wafers can be transferred is formed, as a space that functions as a load lock in the load lock chamber LLM. At this time, the drive unit 12 is configured to form the first space U1 to be smaller than the second space U2. With this configuration, when the space that functions as the load lock is narrowed to the smaller first space U1, a space necessary to supply air or exhaust air can be made smaller than the entire space of the load lock chamber LLM and air supply and exhaust of the load lock chamber LLM can be performed at high speed.

For example, when a same process is performed in the plurality of processing chambers PM such as processing a plurality of wafers of a same lot are performed in the plurality of processing chambers PM, respectively, or the like, the process time performed in the plurality of processing chambers PM are the same. In such a case, it is possible for the control unit 20 to control that carrying of the wafers W into/out from the plurality of processing chambers PM does not overlap. Thus, a case can be prevented in which when a preceding wafer W is being carried into/out from one of the processing chambers, carrying of a wafer W into/out from another one of the processing chambers is suspended. In such a case, it is preferable for the control unit 20 to control that the first space U1 is formed at the center portion of the load lock chamber LLM and each of the wafers W is transferred by using the first space U1.

On the other hand, when different processes are performed in the plurality of processing chambers, the process time performed the processing chambers PM are different. Thus, timings for carrying the wafers W into/out from the plurality of processing chambers PM may overlap. In such a case, a case may occur in which while carrying a preceding wafer W into/out from one of the processing chambers PM, carrying of a wafer W into/out from another one of the processing chambers PM is suspended. In such a case, it is preferable for the control unit 20 to control that the second space U2 is formed between the first opening 9a and the second opening 9B and that the plurality of wafers W are transferred by using the second space U2. As such, according to the substrate processing apparatus 10 of the embodiment, the wafers W are efficiently transferred by using the load lock chamber LLM capable of transferring a single wafer W and transferring a plurality of wafers W.

For example, in this embodiment, it is preferable that the buffer portion 15 is configured such that six wafers W, the same number as the number of the processing chambers PM, can be mounted thereon at most. When different processes are performed at the six processing chambers PM, the number of the wafers that are necessary to be carried into/out from the load lock chamber LLM at almost the same time is at most six. In such a case, at most six wafers W can be mounted on the buffer portion 15. With this configuration, a case can be prevented in which while a single preceding wafer W that is to be precedently processed in one of the processing chambers PM is transferred in the load lock chamber LLM, another next wafer W that is to be processed in another one of the processing chambers PM cannot use the load lock chamber LLM and needs to wait for being carried into/out from the other processing chamber PM.

In this embodiment, the load lock chamber LLM is configured to selectively form the first space U1 in which a single wafer W can be transferred and the second space U2 in which a plurality of wafers W can be transferred in accordance with kinds of processes performed in the plurality of processing chambers PM or process statuses of the wafers W in the processing chambers PM, respectively. With this configuration, the load lock chamber LLM can function as a single wafer processing load lock for which high speed air supply and exhaust can be performed, and a buffer load lock capable of transferring a plurality of wafers.

(Transferring of Wafers)

Next, transferring of the wafers W is described with reference to FIG. 3 to FIG. 8. The wafers W are carried out from the load port LP and transferred to the processing chamber PM through following transferring paths by the transfer apparatus LA and the transfer apparatus VA.

First, the transfer apparatus LA provided in the loader module LM carries a first wafer W (hereinafter, referred to as a "wafer W101") out from the load port LP (S1), transfers it to the orienter ORT and measures the position of the wafer W101 (S2).

Next, the transfer apparatus LA carries a second wafer W (hereinafter, referred to as a "wafer W102") out from the load port LP (S3). At this time, the measurement of the wafer W101 in the orienter ORT is finished (S3).

Then, the transfer apparatus LA carries the wafer W101 out from the orienter ORT, and corrects the position in the loader module LM (S4).

Then, the transfer apparatus LA transfers the wafer W102 to the orienter ORT, and measures the position of the wafer W102 (S5).

Thereafter, the transfer apparatus LA transfers the wafer W101 to the load lock chamber LLM1 (S6). At this time, an evacuating process (vacuuming) is performed in the load lock chamber LLM1 and the pressure of the load lock chamber LLM1 is changed from atmosphere to vacuum (S6 to S10).

While the load lock chamber LLM1 is being vacuumed, the transfer apparatus LA carries a third wafer W (hereinafter, referred to as a "wafer W103") out from the load port LP (S7). At this time, the measurement of the wafer W102 in the orienter ORT is finished (S7).

Then, the transfer apparatus LA carries the wafer W102 out from the orienter ORT, and corrects the position in the loader module LM (S8).

Then, the transfer apparatus LA transfers the wafer W103 to the orienter ORT and measures the position of the wafer W103s (S9).

Thereafter, the transfer apparatus LA transfers the wafer W102 to the load lock chamber LLM2 (S10). At this time, an evacuating process is performed in the load lock chamber LLM2 and the pressure of the load lock chamber LLM2 is changed from atmosphere to vacuum (S10 to S14).

Next, the transfer apparatus LA carries a fourth wafer W (hereinafter, referred to as a "wafer W104") out from the load port LP (S11). At this time, the measurement of the wafer W103 in the orienter ORT is finished (S11).

After the load lock chamber LLM1 is evacuated to vacuum from atmosphere (S10), the transfer apparatus VA carries the wafer W101 out from the load lock chamber LLM1 (S11). Thereafter, the load lock chamber LLM1 is exposed to the atmosphere (S11).

Then, the transfer apparatus LA carries the wafer W103 out from the orienter ORT, and corrects the position in the loader module LM (S12). At this time, the transfer apparatus VA transfers the wafer W101 to a desired one of the processing chambers PM, and starts processing (S12).

Then, the transfer apparatus LA transfers the wafer W104 to the orienter ORT and measures the position of the wafer W104 (S13).

After the load lock chamber LLM2 is evacuated to vacuum from atmosphere (S14), the transfer apparatus VA carries the wafer W102 out from the load lock chamber LLM2 (S15). Thereafter, the load lock chamber LLM2 is exposed to the atmosphere (S15).

Thereafter, the transfer apparatus LA transfers the wafer W103 to the load lock chamber LLM1 (S16). At this time, an evacuating process (vacuuming) is performed in the load lock chamber LLM1 and the pressure of the load lock chamber LLM1 is changed from atmosphere to vacuum (S16).

After being processed in the processing chamber PM, the wafer W is carried out from the processing chamber PM and returned to the load port LP through following transferring paths by the transfer apparatus LA and the transfer apparatus VA. The transfer apparatus VA carries the processed wafer W out from the processing chamber PM and transfers it to the load lock chamber LLM. In the load lock chamber LLM, air is supplied and the pressure becomes atmosphere from vacuum. Under this status, the transfer apparatus LA carries the wafer W out from the load lock chamber LLM and transfers it to the load port LP.

FIG. 7 is a time chart illustrating the above described transferring of each of the wafers W and subsequent transferring of each of the wafers W.

At time 1, the pick A of the transfer apparatus LA carries the wafer W101 out from the load port LP. At time 2, the pick A of the transfer apparatus LA transfers the wafer W101 to the orienter ORT. At time 3, while the wafer W101 is being measured in the orienter ORT, the pick A of the transfer apparatus LA carries the wafer W102 out from the load port LP. At time 4, the pick B of the transfer apparatus LA carries the wafer W101 out from the orienter ORT. At time 5, the pick A of the transfer apparatus LA transfers the wafer W102 to the orienter ORT. At time 6, while the W102 is being measured in the orienter ORT, the pick B of the transfer apparatus LA transfers the wafer W101 to the load lock chamber LLM1. The load lock chamber LLM1 is vacuumed until time 10.

At time 7, the pick A of the transfer apparatus LA carries the wafer W103 out from the load port LP. At time 8, the pick B of the transfer apparatus LA carries the wafer W102 out from the orienter ORT. At time 9, the pick A of the transfer apparatus LA transfers the wafer W103 to the orienter ORT. At time 10, while the wafer W103 is being measured in the orienter ORT, the pick B of the transfer apparatus LA transfers the wafer W102 to the load lock chamber LLM2. The load lock chamber LLM2 is vacuumed until time 14.

At time 11, the pick A of the transfer apparatus LA carries the wafer W104 out from the load port LP. Further, at time 11, the pick C of the transfer apparatus VA carries the wafer W101 out from the load lock chamber LLM1.

At time 12, the pick B of the transfer apparatus LA carries the wafer W103 out from the orienter ORT. The load lock chamber LLM1 is exposed to the atmosphere until time 15. Further, at time 12, the pick C of the transfer apparatus VA transfers the wafer W101 into the processing chamber PM1. At time 13, the pick A of the transfer apparatus LA transfers the wafer W104 to the orienter ORT. At time 14, the wafer W104 is measured and oriented in the orienter ORT. At time 15, the pick C of the transfer apparatus VA carries the wafer W102 out from the load lock chamber LLM1. At time 16, the pick C of the transfer apparatus VA transfers the wafer W102 into the processing chamber PM2 and the pick B of the transfer apparatus LA transfers the wafer W103 to the load lock chamber LLM1.

(Carrying Wafers Into/Out from Processing Chamber)

A basic flow of carrying the wafers W into/out from the processing chambers PM, respectively, becomes different depending on whether a Wafer-Less Dry Cleaning step (hereinafter, referred to as a "WLDC step") is included. When the WLDC step is not included, the flow of carrying the wafers W into/out from the processing chambers PM, respectively, becomes, carrying in a (first) wafer, processing, carrying out the (first) wafer, carrying in a (second) wafer, processing, carrying out the (second) wafer, . . . in this order.

On the other hand, when the WLDC step is included, the flow of carrying the wafers W into/out from the processing chambers PM, respectively, becomes, carrying in a (first) wafer, processing, carrying out the (first) wafer, cleaning, carrying in a (second) wafer, processing, carrying out the (second) wafer, cleaning, . . . in this order.

(Transferring of Wafers: Without WLDC)

Next, transferring of the wafers when the WLDC step is not included is described with reference to FIG. 8. FIG. 8 illustrates an example of a transferring timing of each of the wafers W when the same process is performed in the six processing chambers PM (in other words, the process time is the same in each of the six processing chambers PM).

In such a case, carrying of the wafer W into/out from each of the processing chamber PM is performed by a cycle time of the load lock chamber LLM with an interval in accordance with the number of the load lock chambers LLM. The cycle time of the load lock chamber LLM means time necessary for "carrying the wafer W into/out from the load lock chamber LLM under an atmospheric pressure, vacuuming, carrying the wafer W into/out from the load lock chamber LLM under a vacuum pressure, and exposing to the atmosphere", in this order.

In the substrate processing apparatus 10 having the cluster structure as illustrated in FIG. 1, performance (throughput) is determined by following cycle times.

First cycle is an atmospheric transfer cycle. The atmospheric transfer cycle time is time necessary for "carrying a wafer W out from the load port LP, exchanging the wafer W in the orienter ORT, exchanging the wafer W in the load lock chamber LLM and carrying the wafer W into the load port LP". The above described steps are performed under an atmospheric pressure by the transfer apparatus LA. For the atmospheric transfer cycle performed under such an atmospheric pressure, as the wafer W can be held by vacuum adsorption or the like, the wafer W can be transferred at high speed.

Second cycle is a load lock module cycle. The load lock module cycle time means time necessary for "carrying a wafer W into/out from the load lock chamber LLM under an atmospheric pressure, vacuuming, carrying a wafer W into/out from the load lock chamber LLM under a vacuum pressure and exposing to the atmosphere".

In the vacuuming step, flinging up of particles or condensation may occur in the load lock chamber LLM by evacuating the load lock chamber LLM to vacuum at high speed. Thus, it is impossible to perform the vacuuming step more rapid than a certain pressure decreasing curve. Further, in the step of exposing to the atmosphere, flinging up of particles may occur in the load lock chamber LLM by changing the pressure of the load lock chamber LLM to the atmospheric pressure at high speed. Thus, it is impossible to perform the step of exposing to the atmosphere more rapid than a certain pressure increasing curve. As the rate of time for transferring in the load lock module cycle is determined by such physical phenomenon, the plurality of load lock chambers LLM are provided.

Third cycle is a vacuum transfer cycle. The vacuum transfer cycle time means time necessary for "exchanging a wafer in the load lock chamber LLM by the transfer apparatus VA, and exchanging the wafer in the processing chamber PM by the transfer apparatus VA.

Among the above described cycles, as the rate of the load lock module cycle is limited by physical phenomenon such as flinging up of particles or the like, the following relationship of the process times is obtained. (load lock module cycle)/(the number of LLMs)>(vacuum transfer cycle)≥(atmospheric transfer cycle)

This means that among the above described cycles, the process time of the load lock module cycle is the longest. Further, the load lock module cycle time becomes short as the number of the load lock chambers LLM increases. When the process time of each of the processing chambers PM is the same as the transferring timing illustrated FIG. 8, the wafers W can be carried into/out from the load lock chamber LLM at a constant sequence. In such a case, as illustrated in FIG. 8, carry-in timing of the wafer W is determined almost by the load lock module cycle. Thus, the wafer W can be supplied to one of the processing chambers PM at every load lock module cycle.

However, when the process time at the processing chamber PM is changed for each of the wafers W, end timings of the processes in the plurality of processing chambers PM may overlap. For example, in the following case, end timings of the process in the plurality of processing chambers PM overlap.

The processing chamber PM by which a wafer W is processed is determined for each of the FOUPs provided at the load ports LP. For example, a wafer W at the load port LP1 is processed in the processing chamber PM1, a wafer W at the load port LP2 is processed in the processing chamber PM2 and a wafer W at the load port LP3 is processed in the processing chamber PM3. The processes are performed in the processing chambers PM1 to PM3 in parallel.

When the process time in each of the processing chambers PM is sufficiently long and the processes are performed in the two processing chambers PM in parallel, overlapping of the timings of carrying the wafers W into/out from can be handled by controlling phases of the two load lock chambers LLM. In such a case, the processes in the load lock chambers LLM do not become a bottle neck.

However, when the processes are performed in three or more of the processing chambers PM in parallel as described above, overlapping of the timings of carrying the wafers W into/out from cannot be handled by controlling phases of the two load lock chambers LLM. At the worst case, carrying of a next wafer W into/out from the load lock chamber LLM is suspended for time corresponding to the load lock module cycle/2.

Thus, in this embodiment, the load lock chamber LLM is configured such that its inside is converted between the first space U1 in which a single wafer W is capable of being transferred and the second space U2 in which a plurality of wafers W are capable of being transferred in accordance with kinds of processes performed in the plurality of processing chambers PM or the process statuses of the wafers W.

For example, when the process time in the processing chambers PM are constant, inside the load lock chamber LLM is converted to form the first space U1 in which a single wafer W can be transferred. Further, for example, when the process time in the processing chamber PM is different for each of the wafers W, and the number of the processing chambers PM used in parallel is greater than the number of the load lock chambers LLM, inside the load lock chamber LLM is converted to form the second space U2 in which a plurality of wafers W can be transferred.

With this configuration, when performing a normal single wafer process, the load lock chamber LLM can be used to function as a single wafer processing load lock for which air supply and exhaust can be performed at high speed. Further, when a collision of transferring chances occurs by performing processes in the plurality of processing chambers PM in parallel, the load lock chamber LLM can be used to function as a buffer load lock. With this, throughput can be improved by efficiently transferring wafers while preventing increasing of air supply and exhaust time. Further, in this embodiment, a single load lock chamber LLM has the above described two functions, and is switchable. With this, compared with a case in which two load lock chambers, one of which includes one of the above described functions and the other of which include the other of the above described functions, are provided, foot print does not increase and increasing of cost can be suppressed.

(Switching Timing)

The control unit 20 controls the drive unit 12 to select (form) the second space U2 when the processes to the wafers W in the plurality of processing chambers PM are finished within a predetermined period, respectively, and the plurality of wafers W are to be transferred from the transfer chamber VTM within the predetermined period.

The predetermined period may be, for example, a period necessary for carrying a wafer W out from one of the processing chambers PM and carrying the wafer W into the load lock chamber LLM via the transfer chamber VTM after the process to the wafer W in the processing chambers PM is finished. Thus, for example, if the process to another wafer W in another one of the processing chambers PM is finished while carrying the precedent wafer W out from the one of the processing chambers PM and carrying the wafer W into the load lock chamber LLM via the transfer chamber VTM, the control unit 20 controls the drive unit 12 to select (form) the second space U2. Furthermore, for example, when the processes to the plurality of wafers W in the processing chambers PM are finished substantially at the same time, respectively, and the plurality of wafers W are to be transferred from the transfer chamber VTM substantially at the same time, the control unit 20 controls the drive unit 12 to select (form) the second space U2.

Further, the control unit 20 controls the drive unit 12 to select (form) the second space U2 when transferring a plurality of wafers W into the plurality of processing chambers PM within a predetermined period.

The predetermined period may be, for example, a period necessary for carrying a wafer W out from the load lock chamber LLM and carrying the wafer W into one of the processing chambers PM via the transfer chamber VTM. Thus, for example, if it is desired to carry another wafer W into another one of the processing chambers PM while carrying the precedent wafer W out from the load lock chamber LLM and carrying the wafer W into the one of the processing chambers PM, the control unit 20 controls the drive unit 12 to select (form) the second space U2. Furthermore, for example, when it is desired to transfer the plurality of wafers W to the plurality of processing chambers PM, respectively, substantially at the same time, the control unit 20 controls the drive unit 12 to select (form) the second space U2.

As described above, according to the substrate processing apparatus 10 including the load lock chamber LLM of the embodiment, wafers W can be efficiently transferred by using the load lock chamber LLM capable of changing a transferring space in the load lock chamber LLM between the first space U1 in which a single wafer W can be transferred and the second space U2 in which a plurality of wafers W can be transferred.

According to the embodiment, a technique capable of efficiently transferring substrates by changing a transferring space in a load lock chamber is provided.

Although a preferred embodiment of the substrate transfer method and the substrate processing apparatus has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, the substrate processing apparatus of the embodiment is not limited to a Capacitively Coupled Plasma (CCP) apparatus, and may be adaptable to other substrate processing apparatuses. As the other substrate processing apparatuses, an Inductively Coupled Plasma (ICP) apparatus, a plasma processing apparatus using a Radial Line Slot Antenna, a Helicon Wave Plasma (HWP) apparatus, an Electron Cyclotron Resonance Plasma (ECR) apparatus or the like may be used.

Further, the substrate processed by the substrate processing apparatus of the embodiment is not limited to a wafer and may be a large size substrate for a Flat Panel Display, or a substrate for an EL element or a solar cell, for example.

What is claimed is:

1. A substrate transfer method of a substrate processing apparatus that includes
   a transfer chamber that transfers a substrate,
   a plurality of processing chambers provided around the transfer chamber, each of the processing chambers processing a substrate, and
   a load lock chamber provided around the transfer chamber, capable of being selectively retained at between an atmospheric pressure and a vacuum pressure,
   the load lock chamber including a housing provided with a first opening at an atmospheric side, and a second opening connected to the transfer chamber, and a drive unit that is capable of forming, as a transferring space between the first opening and the second opening, a first space in which a single substrate is capable of being transferred to the transfer chamber via the second opening, and a second space in which a plurality of substrates are capable of being transferred to the transfer chamber via the second opening, in the housing, the first space being smaller than the second space, the substrate transfer method comprising:

selecting either of the first space or the second space of the load lock chamber in accordance with process statuses of substrates at the plurality of processing chambers, and controlling the drive unit based on the selected result to form either of the first space or the second space, wherein the controlling controls the drive unit to select the second space when processing to a plurality of substrates in the plurality of processing chambers, respectively, are finished and transferring the plurality of substrates from the transfer chamber within a predetermined period is performed.

2. The substrate transfer method according to claim 1,
wherein in the controlling, controlling the drive unit to select the second space when transferring a plurality of substrates into the plurality of processing chambers within a predetermined period.

3. The substrate transfer method according to claim 1,
wherein the second space is configured to include a buffer portion on which the number of substrates same as the number of the plurality of processing chambers are mountable.

4. A substrate processing apparatus comprising:
a transfer chamber that transfers a substrate;
a plurality of processing chambers provided around the transfer chamber, each of the processing chambers processing a substrate;
a load lock chamber, provided around the transfer chamber, capable of being selectively retained at between an atmospheric pressure and a vacuum pressure,
the load lock chamber including
a housing provided with a first opening at an atmospheric side, and a second opening connected to the transfer chamber, and
a drive unit that is capable of forming, as a transferring space between the first opening and the second opening, a first space in which only a single substrate is accommodated and transferred at a time to the transfer chamber via the second opening, and a second space in which a plurality of substrates are capable of being transferred to the transfer chamber via the second opening, in the housing, the first space being smaller than the second space; and a control unit that selects either of the first space or the second space of the load lock chamber in accordance with process statuses of substrates at the plurality of processing chambers, wherein the drive unit form either of the first space or the second space based on the selected result, and wherein the control unit controls the drive unit to select the second space when processing to a plurality of substrates in the plurality of processing chambers, respectively, are finished and transferring the plurality of substrates from the transfer chamber within a predetermined period is performed.

5. The substrate transfer method according to claim 1,
wherein the substrate processing apparatus further includes a buffer portion provided in the housing on which the plurality of substrates are mountable,
wherein the second space is formed to include the buffer portion, and
wherein the first space is formed to be separated and sealed from the buffer portion so that the first space is made smaller than the second space.

6. The substrate transfer method according to claim 5,
wherein the substrate processing apparatus further includes a stage provided in the housing on which the buffer portion is mounted,
wherein the first space is formed to be separated and sealed from the buffer portion by the stage.

7. The substrate processing apparatus according to claim 4, further comprising:
a buffer portion provided in the housing on which the plurality of substrates are mountable,
wherein the second space is formed to include the buffer portion, and wherein the first space is formed to be separated and sealed from the buffer portion so that the first space is made smaller than the second space.

8. The substrate processing apparatus according to claim 7, further comprising:
a stage provided in the housing on which the buffer portion is mounted,
wherein the first space is formed to be separated and sealed from the buffer portion by the stage.

9. The substrate processing apparatus according to claim 4, wherein the load lock chamber is provided between the transfer chamber and a loader module, and both of the first space and the second space are connected to the loader module through the first opening, and the both of the first space and the second space are connected to the transfer chamber though the second opening.

* * * * *